United States Patent
Hsieh

(10) Patent No.: US 8,456,233 B2
(45) Date of Patent: Jun. 4, 2013

(54) CHOPPER

(75) Inventor: Zong-Fu Hsieh, Tainan (TW)

(73) Assignee: Himax Technologies Limited, Tainan (TW)

( * ) Notice: Subject to any disclaimer, the term of this patent is extended or adjusted under 35 U.S.C. 154(b) by 7 days.

(21) Appl. No.: 13/289,087

(22) Filed: Nov. 4, 2011

(65) Prior Publication Data
US 2013/0113553 A1    May 9, 2013

(51) Int. Cl.
*H03F 1/02*    (2006.01)
*H03F 3/45*    (2006.01)

(52) U.S. Cl.
USPC .................................................. 330/9; 330/69

(58) Field of Classification Search
USPC .......................... 330/9, 69; 327/124
See application file for complete search history.

(56) References Cited

U.S. PATENT DOCUMENTS 7,265,615 B2 * 9/2007 Alexander et al. .............. 330/69
7,282,980 B2 * 10/2007 Baru ............................. 327/330

* cited by examiner

*Primary Examiner* — Steven J Mottola
(74) *Attorney, Agent, or Firm* — McClure, Qualey & Rodack, LLP

(57) ABSTRACT

A chopper comprises a differential difference amplifier, a first switch, and a second switch. The differential difference amplifier comprises a first input stage and a second input stage. The first input stage comprises a non-inverting input terminal and an inverting input terminal. The second input stage comprises a non-inverting input terminal and an inverting input terminal. The first switch is operable to receive a first input voltage and a second input voltage and selectively transfer the first input voltage to one of the non-inverting input terminal of the first input stage and the non-inverting input terminal of the second input stage. The second switch is operable to receive a third input voltage and a fourth input voltage and selectively transfer the third input voltage to one of the inverting input terminal of the first input stage and the inverting input terminal of the second input stage.

13 Claims, 1 Drawing Sheet

CHOPPER

BACKGROUND

1. Field of Invention

The embodiment of the present invention relates generally to a basic electrical circuit and, more particularly, to a chopper.

2. Description of Related Art

The differential difference amplifier (DDA) is popular for signal processing in the analog domain.

However, there are two main offset imperfections in the differential difference amplifier. One is the intrinsic MOS mismatch and the other is the gain mismatch contributed by the current source of the two input pairs of the DDA.

In order to solve the above problems, those skilled in the art are striving is to find a solution, but no applicable method has yet been put forward. Therefore, there is a need to improve the intrinsic MOS mismatch and the gain mismatch contributed by the current source of the two input pairs in a DDA.

SUMMARY

A chopper is provided so as to improve the intrinsic MOS mismatch and the gain mismatch contributed by the current source of the two input pairs of a differential difference amplifier.

Thus, one aspect of the embodiment of the present invention is to provide a chopper. The chopper comprises a differential difference amplifier, a first switch, and a second switch. The differential difference amplifier comprises a first input stage and a second input stage. The first input stage comprises a non-inverting input terminal and an inverting input terminal. The second input stage comprises a non-inverting input terminal and an inverting input terminal.

Furthermore, the first switch is operable to receive a first input voltage and a second input voltage and selectively transfer the first input voltage to one of the non-inverting input terminal of the first input stage and the non-inverting input terminal of the second input stage. The second switch is operable to receive a third input voltage and a fourth input voltage and selectively transfer the third input voltage to one of the inverting input terminal of the first input stage and the inverting input terminal of the second input stage.

In one embodiment of the present invention, when the first input voltage is transferred to the non-inverting input terminal of the first input stage by the first switch, the second input voltage is transferred to the non-inverting input terminal of the second input stage by the first switch.

In another embodiment of the present invention, when the first input voltage is transferred to the non-inverting input terminal of the second input stage by the first switch, the second input voltage is transferred to the non-inverting input terminal of the first input stage by the first switch.

In yet another embodiment of the present invention, when the third input voltage is transferred to the inverting input terminal of the first input stage by the second switch, the fourth input voltage is transferred to the inverting input terminal of the second input stage by the second switch.

In still another embodiment of the present invention, when the third input voltage is transferred to the inverting input terminal of the second input stage by the second switch, the fourth input voltage is transferred to the inverting input terminal of the first input stage by the second switch.

In yet another embodiment of the present invention, the first switch comprises a first input terminal and a second input terminal, and the first input terminal and the second input terminal of the first switch receive the first input voltage and the second input voltage respectively.

In still another embodiment of the present invention, the chopper further comprises a feedback circuit. The feedback circuit feeds back the output voltage of the differential difference amplifier to one of the first input terminal and the second input terminal of the first switch.

In yet another embodiment of the present invention, the first switch comprises a first output terminal and a second output terminal, and the first output terminal and the second output terminal of the first switch are connected to the non-inverting input terminal of the first input stage and the non-inverting input terminal of the second input stage respectively.

In still another embodiment of the present invention, the second switch comprises a first input terminal and a second input terminal, and the first input terminal and the second input terminal of the second switch receive the third input voltage and the fourth input voltage respectively.

In yet another embodiment of the present invention, the chopper further comprises a feedback circuit. The feedback circuit feeds back the output voltage of the differential difference amplifier to one of the first input terminal and the second input terminal of the second switch.

In still another embodiment of the present invention, the second switch comprises a first output terminal and a second output terminal, and the first output terminal and the second output terminal of the second switch are connected to the inverting input terminal of the first input stage and the inverting input terminal of the second input stage respectively.

In another embodiment of the present invention, the differential difference amplifier further comprises an input stage and an output stage. The input stage comprises the first input stage, the second input stage, a first output terminal, and a second output terminal, and the output stage comprises a non-inverting input terminal and an inverting input terminal. The first output terminal and the second output terminal of the input stage output a first output voltage and a second output voltage respectively.

In yet another embodiment of the present invention, the chopper further comprises a third switch. The third switch is operable to receive the first output voltage and the second output voltage and selectively transfer the first output voltage to one of the non-inverting input terminal of the output stage and the inverting input terminal of the output stage.

In still another embodiment of the present invention, when the first input voltage is transferred to the non-inverting input terminal of the first input stage by the first switch, and the third input voltage is transferred to the inverting input terminal of the first input stage by the second switch, the first output voltage is transferred to the non-inverting input terminal of the output stage by the third switch.

In yet another embodiment of the present invention, when the first input voltage is transferred to the non-inverting input terminal of the second input stage by the first switch, and the third input voltage is transferred to the inverting input terminal of the second input stage by the second switch, the second output voltage is transferred to the inverting input terminal of the output stage by the third switch.

In summary, the chopper is provided so as to improve the intrinsic MOS mismatch and the gain mismatch contributed by the current source of the two input pairs of the differential difference amplifier.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
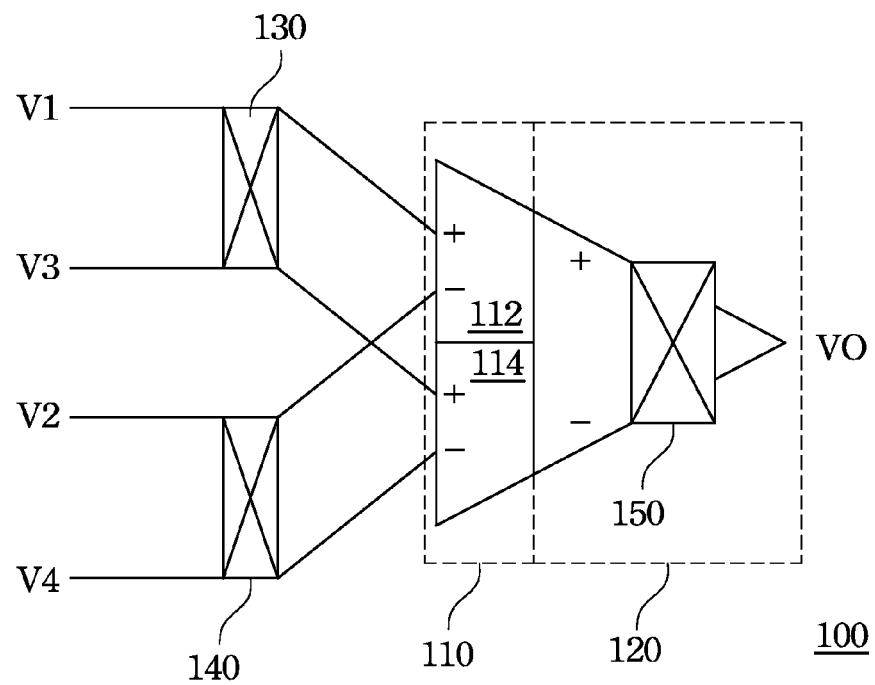
FIG. 1 shows schematically a circuit diagram of a chopper according to embodiments of the present invention.

The present disclosure is more particularly described in the following examples that are intended as illustrative only since numerous modifications and variations therein will be apparent to those skilled in the art. Various embodiments of the disclosure are now described in detail. Referring to the drawings, like numbers indicate like components throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification, including examples of any terms discussed herein, is illustrative only, and in no way limits the scope and meaning of the disclosure or of any exemplified term. Likewise, the disclosure is not limited to various embodiments given in this specification.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

As used herein, the terms "comprising," "including," "having," "containing," "involving," and the like are to be understood to be open-ended, i.e., to mean including but not limited to.

In the prior art, the differential difference amplifier with the conventional chopper stabilization has the following basic properties:

$$(V1-V2+Vos1)gm1=(V3-V4+Vos2)gm2; \quad \text{State 1:}$$

$$(V1-V2-Vos1)gm1=(V3-V4-Vos2)gm2 \quad \text{State 2:}$$

where V1 and V2 are the input voltages of a first input stage, V3 and V4 are the input voltages of a second input stage, Vos1 is the intrinsic MOS offset of the first input stage, Vos2 is the intrinsic MOS offset of the second input stage, gm1 is the gain of the first input stage, and gm2 is the gain of the second input stage.

If gain mismatch is not considered, the MOS intrinsic offset can be removed. The following results occur when gain mismatch is included and the following assumptions related to gm1 and gm2 are made:

$$gm1=gm+\Delta gm; \quad (1\text{-}1)$$

$$gm2=gm-\Delta gm; \quad (1\text{-}2)$$

$$(V1-V2+Vos1)(gm+\Delta gm)=(V3-V4+Vos2)(gm-\Delta gm); \quad \text{State 1:}$$

$$(V1-V2-Vos1)(gm+\Delta gm)=(V3-V4-Vos2)(gm-\Delta gm). \quad \text{State 2:}$$

where V1 and V2 are the input voltage of the first input stage, V3 and V4 are the input voltage of the second input stage, Vos1 is the intrinsic MOS offset of the first input stage, Vos2 is the intrinsic MOS offset of the second input stage, and gm and $\Delta$gm are as defined above.

After chopper stabilization, the residual terms, (V1-V2)$\Delta$gm and (V3-V4)$\Delta$gm, remain as they are not removed by the conventional chopper stabilization.

In order to improve the gain mismatch in the prior art, the embodiment of the present invention provides a chopper for chopper stabilization. FIG. 1 shows schematically a circuit diagram of a chopper 100 according to embodiments of the present invention. As shown in FIG. 1, the chopper 100 according to embodiments of the present invention comprises a differential difference amplifier, a first switch 130, and a second switch 140. The differential difference amplifier comprises a first input stage 112 and a second input stage 114. The first input stage 112 comprises a non-inverting input terminal and an inverting input terminal. The second input stage 114 comprises a non-inverting input terminal and an inverting input terminal.

Furthermore, the first switch 130 is operable to receive a first input voltage V1 and a third input voltage V3, and to selectively transfer the first input voltage V1 to one of the non-inverting input terminal of the first input stage 112 and the non-inverting input terminal of the second input stage 114. In addition, the first switch 130 is operable to selectively transfer the third input voltage V3 to one of the non-inverting input terminal of the first input stage 112 and the non-inverting input terminal of the second input stage 114.

Moreover, the second switch 140 is operable to receive a second input voltage V2 and a fourth input voltage V4, and to selectively transfer the second input voltage V2 to one of the inverting input terminal of the first input stage 112 and the inverting input terminal of the second input stage 114. In addition, the second switch 140 is operable to selectively transfer the fourth input voltage V4 to one of the inverting input terminal of the first input stage 112 and the inverting input terminal of the second input stage 114.

With the proposed chopper 100 in FIG. 1, the states can be described as follows:

$$(V1-V2+Vos1)gm1=(V3-V4+Vos2)gm2; \quad \text{State 1:}$$

$$(V1-V2+Vos2)gm2=(V3-V4+Vos1)gm1. \quad \text{State 2:}$$

When the gain mismatch is considered and the assumptions related to gm1 and gm2 are made, the results as outlined below are obtained:

$$gm1=gm+\Delta gm;$$

$$gm2=gm-\Delta gm;$$

$$(V1-V2+Vos1)(gm+\Delta gm)=(V3-V4+Vos2)(gm-\Delta gm);$$

$$\rightarrow (V1-V2)(gm+\Delta gm)+Vos1(gm+\Delta gm)=(V3-V4)(gm-\Delta gm)+Vos2(gm-\Delta gm); \quad \text{State 1:}$$

$$(V1-V2+Vos2)(gm-\Delta gm)=(V3-V4+Vos1)(gm+\Delta gm);$$

$$\rightarrow (V1-V2)(gm-\Delta gm)-Vos1(gm+\Delta gm)=(V3-V4)(gm+\Delta gm)-Vos2(gm-\Delta gm). \quad \text{State 2:}$$

where V1 and V3 are the input voltage of the first input stage 112, V2 and V4 are the input voltage of the second input stage 114, Vos1 is the intrinsic MOS offset of the first input stage 112, Vos2 is the intrinsic MOS offset of the second input stage 114, and gm and $\Delta$gm are as defined above.

The residual terms (V1−V2)Δgm and (V3−V4)Δgm in the prior art can be removed with the use of the proposed chopper 100 in this embodiment of the present invention.

As a result, the chopper 100 is provided so as to improve the intrinsic MOS mismatch and further improve the gain mismatch contributed by the current source of the two input pairs.

Reference is again made to FIG. 1 to specifically describe the operation of the chopper 100. When the first input voltage V1 is transferred to the non-inverting input terminal of the first input stage 112 by the first switch 130, the third input voltage V3 is transferred to the non-inverting input terminal of the second input stage 114 by the first switch 130.

In one embodiment, when the first input voltage V1 is transferred to the non-inverting input terminal of the second input stage 114 by the first switch 130, the third input voltage V3 is transferred to the non-inverting input terminal of the first input stage 112 by the first switch 130.

When the second input voltage V2 is transferred to the inverting input terminal of the first input stage 112 by the second switch 140, the fourth input voltage V4 is transferred to the inverting input terminal of the second input stage 114 by the second switch 140.

In another embodiment, when the second input voltage V2 is transferred to the inverting input terminal of the second input stage 114 by the second switch 140, the fourth input voltage V4 is transferred to the inverting input terminal of the first input stage 112 by the second switch 140.

As shown in FIG. 1, the first switch 130 comprises a first input terminal and a second input terminal, and the first input terminal and the second input terminal of the first switch 130 receive the first input voltage V1 and the third input voltage V3 respectively.

In one embodiment, the first switch 130 comprises a first output terminal and a second output terminal, and the first output terminal and the second output terminal of the first switch 130 are connected to the non-inverting input terminal of the first input stage 112 and the non-inverting input terminal of the second input stage 114 respectively.

In another embodiment, the second switch 140 comprises a first input terminal and a second input terminal, and the first input terminal and the second input terminal of the second switch 140 receive the second input voltage V2 and the fourth input voltage V4 respectively.

The second switch 140 comprises a first output terminal and a second output terminal, and the first output terminal and the second output terminal of the second switch 140 are connected to the inverting input terminal of the first input stage 112 and the inverting input terminal of the second input stage 114 respectively.

In one embodiment, the differential difference amplifier of the chopper 100 further comprises an input stage 110 and an output stage 120. The input stage 110 comprises the first input stage 112, the second input stage 114, a first output terminal, and a second output terminal, and the output stage 120 comprises a non-inverting input terminal and an inverting input terminal. The first output terminal and the second output terminal of the input stage 110 output a first output voltage and a second output voltage respectively.

As shown in FIG. 1, the chopper 100 further comprises a third switch 150. The third switch 150 is operable to receive the first output voltage and the second output voltage and selectively transfer the first output voltage to one of the non-inverting input terminal of the output stage 120 and the inverting input terminal of the output stage 120.

In one embodiment, when the first input voltage V1 is transferred to the non-inverting input terminal of the first input stage 112 by the first switch 130, and the second input voltage V2 is transferred to the inverting input terminal of the first input stage 112 by the second switch 140, the first output voltage is transferred to the non-inverting input terminal of the output stage 120 by the third switch 150.

In another embodiment, when the first input voltage V1 is transferred to the non-inverting input terminal of the second input stage 114 by the first switch 130, and the second input voltage V2 is transferred to the inverting input terminal of the second input stage 114 by the second switch 140, the second output voltage is transferred to the non-inverting input terminal of the output stage 120 by the third switch 150.

Figure 2:
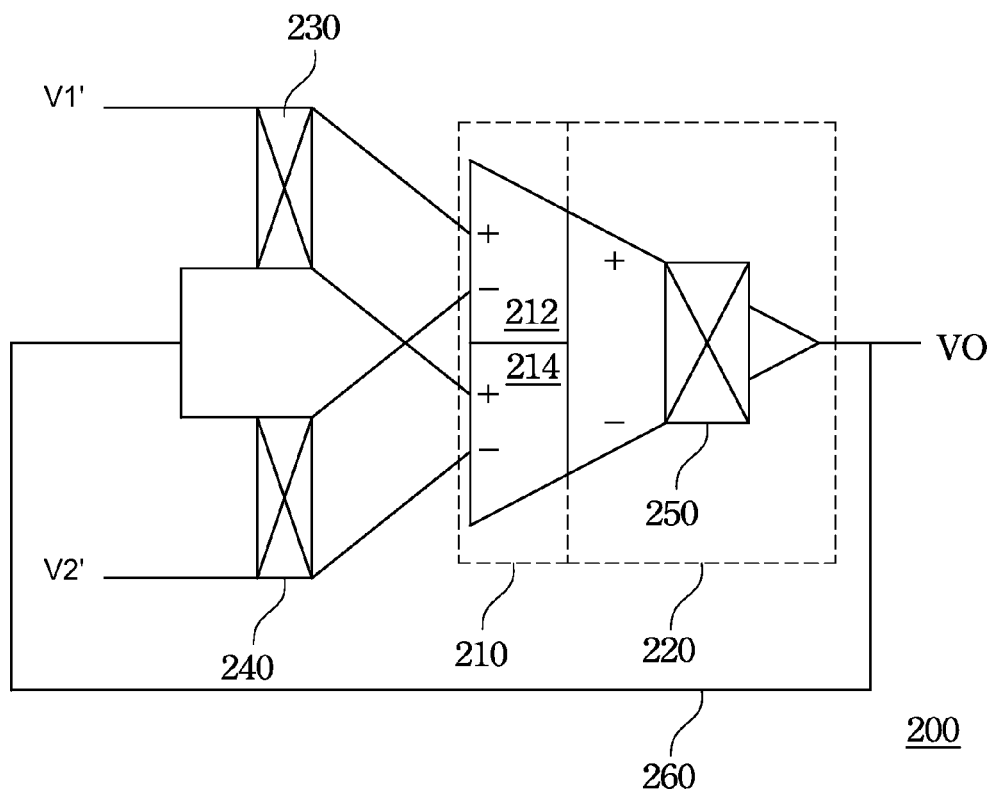
FIG. 2 shows schematically a circuit diagram of a chopper according to embodiments of the present invention.

FIG. 2 shows schematically a circuit diagram of a chopper 200 according to embodiments of the present invention. Compared with the chopper 100 as shown in FIG. 1, the chopper 200 herein further comprises a feedback circuit 260. As shown in FIG. 2, the feedback circuit 260 feeds back the output voltage of the differential difference amplifier to the second input terminal of the first switch 230 and the first input terminal of the second switch 240. However, the scope of the present application is not intended to be limited to this embodiment, which is merely an exemplary embodiment of the present invention.

By similar analysis, when the parameters in FIG. 2 is substituted in formulas 1-1 and 1-2 as shown in page 8, the chopper 200 in FIG. 2 has the following formulas:

$$\text{State 1:} V_O = \frac{(V1' + \Delta V1)gm1 + (V2' + \Delta V2)gm2}{gm1 + gm2} =$$

$$\frac{V1'gm1 + V2'gm2}{gm1 + gm2} + \frac{\Delta V1gm1 + \Delta V2gm2}{gm1 + gm2} =$$

$$\frac{V1'(gm + \Delta gm) + V2'(gm - \Delta gm)}{gm + gm} + \frac{\Delta V1gm1 + \Delta V2gm2}{gm1 + gm2} =$$

$$\frac{gm(V1' + V2')}{gm + gm} + \frac{(V1' - V2')\Delta gm}{gm + gm} + \frac{\Delta V1gm1 + \Delta V2gm2}{gm1 + gm2}$$

$$\text{State 2:} V_O = \frac{(V1' - \Delta V2)gm2 + (V2' - \Delta V1)gm1}{gm1 + gm2} =$$

$$\frac{V1'gm2 + V2'gm1}{gm1 + gm2} - \frac{\Delta V1gm1 + \Delta V2gm2}{gm1 + gm2} =$$

$$\frac{V1'(gm - \Delta gm) + V2'(gm + \Delta gm)}{gm + gm} - \frac{\Delta V1gm1 + \Delta V2gm2}{gm1 + gm2} =$$

$$\frac{gm(V1' + V2')}{gm + gm} - \frac{(V1' - V2')\Delta gm}{gm + gm} - \frac{\Delta V1gm1 + \Delta V2gm2}{gm1 + gm2}$$

where V1' and V3' are the input voltages of the first input stage, V2' and V4' are the input voltages of the second input stage, ΔV1 is the intrinsic MOS offset of the first input stage 212, ΔV2 is the intrinsic MOS offset of the second input stage 214, and gm and Δgm are as defined above.

The term with Δgm can be removed with the use of the proposed chopper 200 in this embodiment of the present invention.

As a result, the chopper 200 is provided so as to improve the intrinsic MOS mismatch and further improve the gain mismatch contributed by the current source of the two input pairs.

With respect to an actual implementation, the feedback circuit 260 can feed back the output voltage of the differential difference amplifier to one of the first input terminal and the second input terminal of the first switch 230 and feed back the output voltage of the differential difference amplifier to one of the first input terminal and the second input terminal of the second switch 240, depending on actual requirements.

The remaining electrical elements in FIG. 2 have been described with reference to FIG. 1, and accordingly, a detailed description regarding such remaining electrical elements in FIG. 2 is omitted herein for the sake of brevity.

In view of the foregoing embodiments of the present invention, many advantages of the present invention are now apparent. The embodiments of the present invention provide a chopper so as to improve the intrinsic MOS mismatch and the gain mismatch contributed by the current source of the two input pairs.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention, and the scope thereof is determined by the claims that follow.

What is claimed is:

1. A chopper comprising:
    a differential difference amplifier comprising:
        a first input stage comprising a non-inverting input terminal and an inverting input terminal; and
        a second input stage comprising a non-inverting input terminal and an inverting input terminal;
    a first switch for receiving a first input voltage and a second input voltage and selectively transferring the first input voltage to one of the non-inverting input terminal of the first input stage and the non-inverting input terminal of the second input stage; and
    a second switch for receiving a third input voltage and a fourth input voltage and selectively transferring the third input voltage to one of the inverting input terminal of the first input stage and the inverting input terminal of the second input stage.

2. The chopper according to claim 1, wherein when the first input voltage is transferred to the non-inverting input terminal of the first input stage by the first switch, the second input voltage is transferred to the non-inverting input terminal of the second input stage by the first switch.

3. The chopper according to claim 2, wherein when the first input voltage is transferred to the non-inverting input terminal of the second input stage by the first switch, the second input voltage is transferred to the non-inverting input terminal of the first input stage by the first switch.

4. The chopper according to claim 1, wherein when the third input voltage is transferred to the inverting input terminal of the first input stage by the second switch, the fourth input voltage is transferred to the inverting input terminal of the second input stage by the second switch.

5. The chopper according to claim 4, wherein when the third input voltage is transferred to the inverting input terminal of the second input stage by the second switch, the fourth input voltage is transferred to the inverting input terminal of the first input stage by the second switch.

6. The chopper according to claim 1, wherein the first switch comprises a first input terminal and a second input terminal, and the first input terminal and the second input terminal of the first switch receive the first input voltage and the second input voltage respectively.

7. The chopper according to claim 6, further comprising:
    a feedback circuit for feeding back the output voltage of the differential difference amplifier to one of the first input terminal and the second input terminal of the first switch.

8. The chopper according to claim 1, wherein the first switch comprises a first output terminal and a second output terminal, and the first output terminal and the second output terminal of the first switch are connected to the non-inverting input terminal of the first input stage and the non-inverting input terminal of the second input stage respectively.

9. The chopper according to claim 1, wherein the second switch comprises a first input terminal and a second input terminal, and the first input terminal and the second input terminal of the second switch receive the third input voltage and the fourth input voltage respectively.

10. The chopper according to claim 9, further comprising:
    a feedback circuit for feeding back the output voltage of the differential difference amplifier to one of the first input terminal and the second input terminal of the second switch.

11. The chopper according to claim 1, wherein the second switch comprises a first output terminal and a second output terminal, and the first output terminal and the second output terminal of the second switch are connected to the non-inverting input terminal of the first input stage and the non-inverting input terminal of the second input stage respectively.

12. The chopper according to claim 1, wherein when the first input voltage is transferred to the non-inverting input terminal of the first input stage by the first switch, and the third input voltage is transferred to the inverting input terminal of the first input stage by the second switch.

13. The chopper according to claim 1, wherein when the first input voltage is transferred to the non-inverting input terminal of the second input stage by the first switch, and the third input voltage is transferred to the inverting input terminal of the second input stage by the second switch.

* * * * *